United States Patent [19]
Leidich

[11] Patent Number: 5,574,609
[45] Date of Patent: Nov. 12, 1996

[54] FAIL-SAFE MOS SHUTDOWN CIRCUITRY

[75] Inventor: Arthur J. Leidich, Flemington, N.J.

[73] Assignee: Harris Corporation, Melbourne, Fla.

[21] Appl. No.: 180,267

[22] Filed: Jan. 12, 1994

[51] Int. Cl.$^6$ .................................................. H02H 9/00
[52] U.S. Cl. ................................................ 361/56; 361/91
[58] Field of Search .......................... 361/54, 56, 58, 361/91–93, 100, 101, 110, 111

[56]  References Cited

U.S. PATENT DOCUMENTS

| | | | |
|---|---|---|---|
| 3,947,727 | 3/1976 | Stewart | 361/91 |
| 4,860,152 | 8/1989 | Osborn | 361/91 |
| 5,359,211 | 10/1994 | Groft | 361/101 |
| 5,400,202 | 3/1995 | Metz et al. | 361/56 |

*Primary Examiner*—Jeffrey A. Gaffin
*Assistant Examiner*—Ronald W. Leja
*Attorney, Agent, or Firm*—Joel I. Rosenblatt

[57]  ABSTRACT

A dual discharge network is shown discharging any residual charge on the gates of MOSFET's used to protect a device from over voltages. The dual discharge networks are separately responsive to a positive or negative voltage at an input terminal such as an I/O input terminal, for example. Bias to each of the discharge networks is provided by the positive or negative I/O voltage and power to the transistors within each discharge network is provided by the MOSFET gate charges. In this way, a conduction path is formed between the positively and negatively charged MOSFET gates driving the gates towards ground, driving the MOSFETs to non-conduction and isolating a protected device from a I/O over-voltage where positive or negative.

15 Claims, 2 Drawing Sheets

FAIL-SAFE MOS SHUTDOWN CIRCUITRY

FIELD OF THE INVENTION

This invention relates to over voltage protection devices, and particularly to MOSFET over-voltage protection devices.

BACKGROUND OF THE INVENTION

Devices offering protection from over voltages are well known. For example, such MOSFET protection devices provide protection from surges on the main power supply line and on input/output signal lines.

In the event a voltage supply is lost, such as, for example causing a loss of bias, the protected device may still be subject to voltage surges. For example, where discrete MOSFET's are used to protect a device from over voltages, residual bias may leave the MOSFET gate fully charged causing the MOSFET to continue to function and subjecting the protected device to a voltage surge.

SUMMARY OF THE INVENTION

According to the principles of the invention, the preferred embodiment provides a means for discharging the gates of MOSFET protection devices. This isolates the protected device, disconnecting the protected device from the voltage source. In particular, and according to the principles of the invention, as shown in the preferred embodiment MOSFETs, used to protect a device from over voltage, are discharged, turning them off and protecting the protected device's power and I/O terminals from positive or negative over voltages.

In normal operation, MOSFET's are placed between a supply, such as a power supply $V_{DD}$ or an I/O input to protect against over voltages. As would be known to those skilled in the art, and not forming part of the invention, the MOSFET's can provide a stable current to the protected devices whenever the voltage at the drain of the MOSFET's rises or spikes. Where the protected device loses internal power, it may be desirable to isolate the protected device from the supply such as the power supply $V_{DD}$ or the I/O input, by draining any residual bias on the gates of the MOSFET's. By draining this residual bias, the protected device may be isolated from any over power voltage surge such as $V_{DD}$ or any I/O input voltage surge.

As shown in the preferred embodiment, the I/O terminal is protected by a MOSFET having a positive gate bias and a MOSFET having a negative gate bias. As would be apparent to those skilled in the art, this protects a protected device from I/O over-voltages which may be positive or negative. Accordingly, to isolate any protected device from any such I/O positive or negative over-voltages, it is necessary to drain any residual gate bias from the positive or negatively biased gates. According to the principles of the invention and as shown in the preferred embodiment, this dual capability or duality is achieved by a discharge network comprising bi-polar transistors. As explained below, a positively biased MOSFET protection device is used to protect a device from positive I/O over-voltages and a negatively biased MOSFET protection device is used to protect the protected device from I/O negative over-voltages. The dual discharge network is capable, according to the principles of the invention, of discharging the positive and the negative charged gates of the positive and negative MOSFET protection devices whether the I/O voltage is positive or negative.

This discharging is achieved by discharging the MOSFET protection device gate bias having the same polarity as the I/O voltage, to the gate of the oppositely charged I/O MOSFET protection device.

In this way, the residual bias on the I/O positive and negative MOSFET protection device gates are driven toward ground. With gate bias removed, the NMOSFET's are normally off and not conducting, isolating the protected device from overvoltages.

Accordingly, what is shown is a dual discharge network for reducing residual bias on the gates of over voltage protection devices. The dual discharge networks comprises two networks each of a pair of semiconductors of opposite polarity. Each of the semiconductor pair has an input terminal and each input terminal is connected to a common terminal for example, as shown in the preferred embodiment in IO input terminal which may have a positive or negative voltage.

The dual discharge networks reduce the charge on the gates of MOSFET over voltage protection devices as shown in the preferred embodiment. These MOSFETS each have a gate terminal and an input terminal connected to a common terminal, as stated above, which may be a I/O input terminal having a positive or negative voltage. The input terminals of the first and second pair of semiconductors are each connected to the common terminal. The first semiconductor pair is arrange to be biased into conduction by a positive signal at the common terminal with the second semiconductor pair arranged to be biased into conduction by a negative signal to common terminal. In this way, the dual discharge network operates the discharge the positive and negative residual bias on the gates of the over-voltage protection devices operating separately by a positive or negative signal at the IO terminal respectively.

In the preferred embodiment, the semiconductor pair is shown as a transistor pair with transistors in each network of opposite polarity and connected through the respective input terminal to the common terminal to be biased into conduction by a positive or a negative voltage at the common terminal. In the preferred embodiment the first discharge network is an NPN and a PNP transistor and the second discharge network is a PNP and an NPN transistor. This is in respect to the preferred embodiment where the first gate is shown biased positively and the second gate is biased negatively.

A control over the bias to the dual discharge network is through a switch. In the preferred embodiment, it is shown its desirable to remove the bias from the gates of the MOSFET over-protection devices when power is lost by a protected device. In this case, a bias supply controls a switch means which when conducting in response to the bias supply being present, prevents bias being applied to the first and second input terminals of the dual discharge networks. When internal power is lost, that bias supply is removed turning off the semiconductor switch and removing the conducting path to ground from the first and second terminals of the dual discharge network. As the semiconductors within the switch are connected to be backed biased, a high impedance path is created allowing bias to be applied to the first and second input terminals separately, with respect to the polarity of the signal at the common terminal, turning the dual discharge network into conduction and discharging the gates of the MOSFET overprotection devices.

DESCRIPTION OF PREFERRED EMBODIMENT

Figure 1:
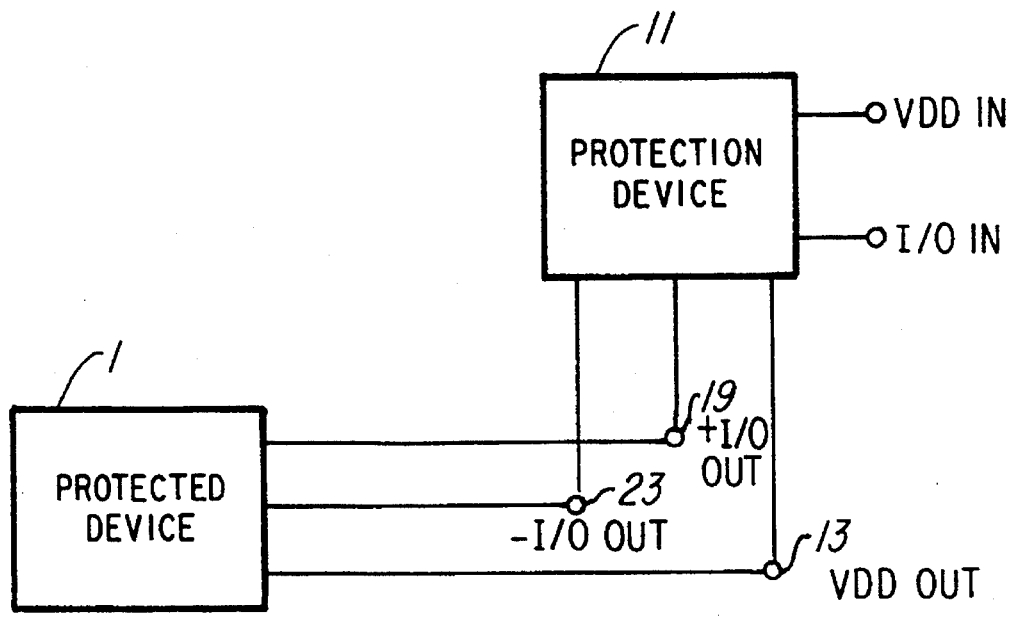
FIG. 1 shows the protection device connected to a protected device.

FIG. 1 shows in block diagram how the protecting device 11 is connected to the protected device 1.

As shown in FIG. 1, the protecting device 11 is shown connected to the protected device 1 and to the Power Supply Terminal VDD IN and the I/O IN terminals. As would be understood by those skilled in the art, the power supply voltage VDD may be supplied by an external source or internally within the protected device.

Figure 2:
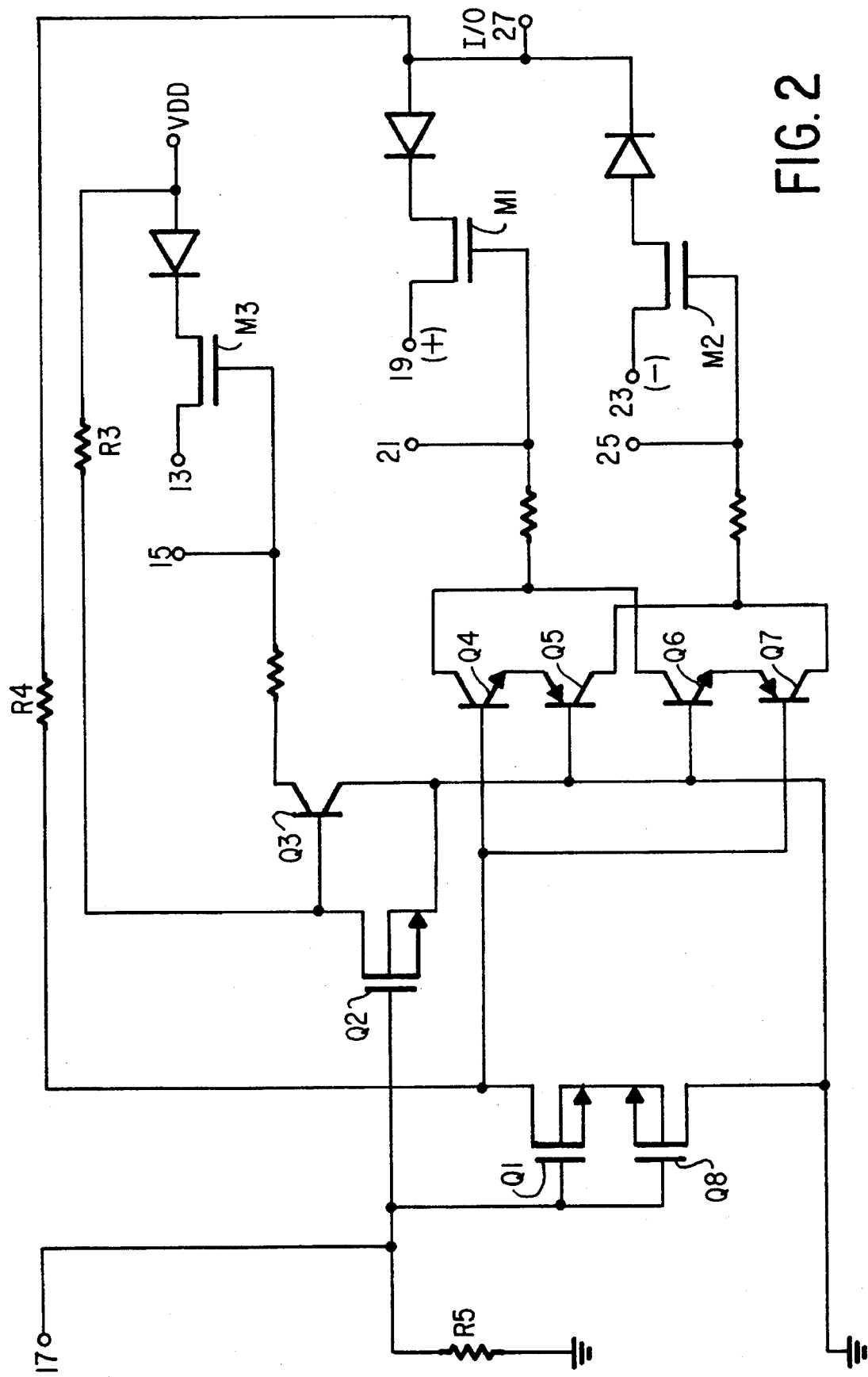
FIG. 2 shows the protection device in detail.

The preferred embodiment of the protection device, according to the inventive principles and referenced by block 11 in FIG. 1 is shown in detail in FIG. 2. In the preferred embodiment, the protection device 11 operates to protect the protected device 1, for example when internal power to the protected device is lost, as may be indicated for example when bias is lost at terminal 17. In that event, the protection device 11 discharges the gates M1, M2, and M3 of the protecting device 11, isolating the protected device from any over voltages at $V_{DD}$ IN or I/O IN.

As shown in FIG. 2, a bias supply, at terminal 17 indicative of internal power in the protected device 1 for the preferred embodiment is connected to ground by an external resistance R5. As will be understood by those skilled in the art, this resistance may be modified in accordance with circuit design requirements. The current flowing through the resistor R5 produces bias for Q1 and Q8, shown, as NMOSFET's in the preferred embodiment.

In normal operation, with the bias supply present at terminal 17, Q2 is its conducting state due to the voltage from terminal 17 across the resistor R5. Q2 provides a path from VDD and R3 to ground, so Q3 is off, maintaining the bias charge from terminal 15 on the gate of M3. In the event the bias supply on terminal 17 fails indicating an internal power supply failure in the protected device 1, Q2 is turned off so bias can be provided from $V_{DD}$ and R3 to the base of Q3 and turning Q3 on to provide a current path to ground, discharging the gate of M3 and, turning M3 off by removing the residual charge on its gate and isolating M3 from VDD from the protective device.

In the case of the I/O terminal 27, in the preferred embodiment, where the I/O voltage may be positive or negative the gate of M1 is biased positively by terminal 21 and the gate of M2 is biased negatively by terminal 25. As external I/O voltage at terminal 27 can either be negative or positive, as would be understood by those skilled in the art, a positive or negative I/O signal at 27 would be passed to protected device 1 by M1 and a negative I/O signal by M2, respectively. According to the inventive principles, as shown in the preferred embodiment, the dual discharge circuit contains bi-directional capability for discharging the gates of M1 and M2, whenever internal power fails to the protected device 1, and it is desirable to isolate input terminals 19 and 23 from the I/O terminal 27, as shown in FIGS. 1 and 2, whether the voltage at the I/O IN terminal is positive or negative.

In normal operation for the preferred embodiment, when internal power is provided to the protected device 1, a bias voltage is similarly provided on terminal 17. The MOSFET's Q1 and Q8, shown as enhancement NMOSFET's, are normally off without the bias, provided by the bias voltage supply at terminal 17 and R5. Accordingly with bias at 17, Q1 and Q8 conduct, bringing the base of Q4 and Q7 close to ground and turning off Q4 and Q7. Accordingly, the positive and negative bias supply at terminals 21 and 25 charges the gates of M1 and M2.

In the case of an internal power failure to the protected device, where it is desired to isolate protected device 1 from the I/O input terminal 27, bias is removed from the gates M1 and M2 and any residual bias is drained by the dual discharge networks comprising transistors Q4 and Q5 and transistors Q6 and Q7.

Figure 3:
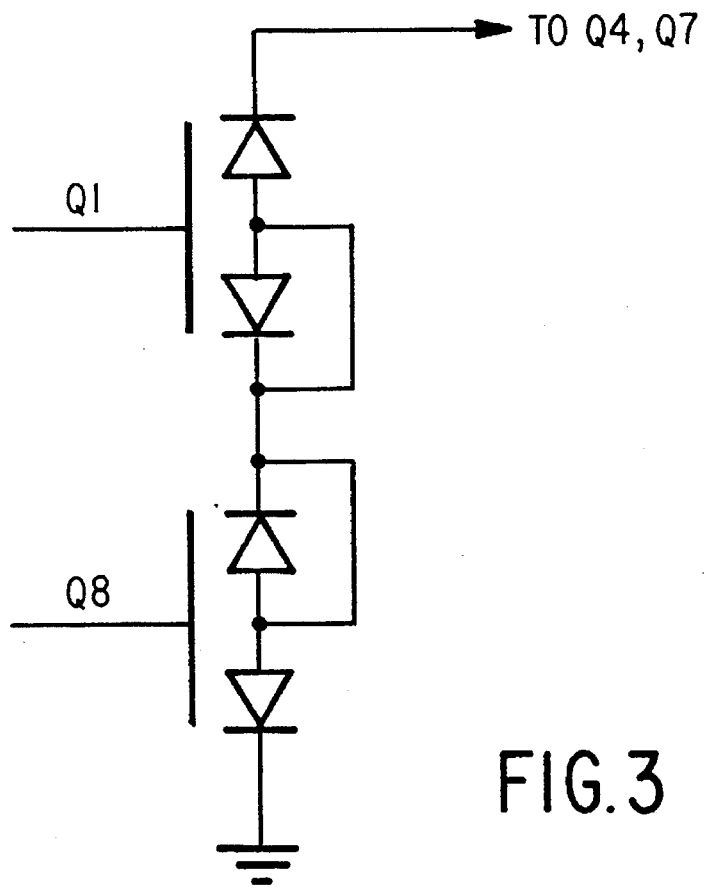
FIG. 3 shows in schematic form, the reversed biased series connected diodes comprised by MOSFETs Q1 and Q8.

Assume bias is lost at terminal 17 indicating a power failure within the protected device 1. In that case, bias is removed from the gates of Q1 and Q8 turning off Q1 and Q8. The configuration of Q1 and Q8 is as shown in FIG. 3, schematically. In the off condition, the diodes of Q8 are reverse biased and in series in relation to the diodes of Q1. This reverse bias arrangement of Q8 relative to Q1 prevents current flow through R4 to ground from the I/O terminal 27 when bias is removed from the gates of Q1 and Q8. Accordingly when bias is present at terminal 17, Q1 and Q8 conduct so the only path to ground from the I/O terminal 27 is through R4, preventing any bias from being provided to bases of Q4 and Q7.

When bias at terminal 17 is removed, as explained above the dual discharge network discharges the gates of M1 and M2 whether the I/O IN voltage is positive or negative. As explained below, each network separately discharges the positively and negatively charged gates of the MOSFET protection devices M1 and M2 depending whether the I/O terminal contains a positive or negative signal.

For example, referring to the first of the dual discharge networks comprising transistors Q4 and Q5, it may be seen how the positively charged gate of M1 and the negatively charged gate of M2 may be discharged isolating the protected device 1 from the I/O terminal 27. As shown for the preferred embodiment, assuming internal power is lost to the protected device 1, the bias 17 is removed from the gates of NMOSFET Q1 and Q8. NMOSFET's Q1 and Q8 are then driven into cut-off. As may be seen, the base of Q4 is two base to emitter voltage ($V_{BE}$) drops above ground. A positive I/O signal present at terminal 27 is applied through R4 to the base of Q4 biasing Q4 and Q5. The positive charge on the gate of M1 provides collector to emitter voltage (VCE) driving the NPN transistor Q4 into conduction and providing bias to the PNP transistor Q5. Collector to emitter voltage for PNP Q5 is provided by the negative voltage at the gate of M2. Accordingly, a conductive path is made between the gates of M1 and M2 driving the gates of M1 and M2 toward ground and removing any residual bias from the gates M1, M2.

In the event the I/O voltage at terminal 27 is negative when internal power fails, as explained above the bias of terminal 17 is removed from Q1 and Q8, and the second transistor pair Q6, Q7 within the dual network is used to discharge the gates of M1 and M2. A negative voltage at I/O terminal 27 is applied through R4 to the base of PNP transistor Q7 and through the emitter to base junction of NPN transistor Q6 to ground, biasing on Q7 and Q6. Collector voltage to Q6 is provided by the positive charge on M1 and collector voltage to Q7 is provided by the negative charge on M2. Q6 and Q7 provide a conductive path between M1 and M2 driving the voltages at the gates of M1 and M2 towards ground.

Accordingly, as can be seen, a dual discharge network provides capability for discharging the positive and negatively charged gates of MOSFET I/O protection devices whether the I/O signal is positive or negative.

In the preferred embodiment, the first discharge network Q4, Q5 responsive to a positive I/O signal is shown as a NPN transistor connected to a PNP transistor. The second discharge network Q6, Q7 responsive to a negative I/O signal is shown as a PNP and an NPN transistor. As would be apparent to those skilled in the art, the invention is not restricted to the particular types of transistors or N MOSFET shown and these N MOSFETs and transistors may be arranged in different polarities and types consistent with the principles of the invention. Examples of bi-polar transistors which may be used to practice invention are for example RCA type CA3096. N MOSFET's which may be used to practice the invention are Harris type 2N6755. A PMOS which may be used is Harris type 2N6895.

I claim:

1. A dual discharge network for reducing residual charge on the gates of MOSFET over-voltage protection devices, comprising:

a first MOSFET over-voltage protection device having a first gate terminal and a first input terminal;

a second MOSFET over-voltage protection device having a second gate terminal and a second input terminal;

said first and second input terminals connected to common terminal;

a first discharge network including a first transistor pair of opposite polarity and a first input terminal for said first discharge network;

a second discharge network including a second transistor pair of opposite polarity and a second input terminal for said second discharge network;

said first input terminal of said first discharge terminal, and said second input terminal of said second discharge terminal connected to said common terminal, to discharge said first and second gate terminals of said first and second MOSFET's;

said first transistor pair arranged to be biased into conduction by a positive signal at said common terminal;

said second transistor pair arranged to be biased into conduction by a negative signal at said common terminal to discharge the said first and second gates of said first and second MOSFET's; and said first transistor pair and said second transistor pair are arranged to receive base emitter bias from said common terminal and collector voltage from said first and second gates, respectively.

2. The dual discharge network of claim 1, wherein:

said first gate terminal is biased positively and said second gate terminal is biased negatively.

3. The dual discharge network of claim 2, including:

a switch:

means for changing said switch from a first conductive state to a second non-conductive state;

said switch connected to the bases of said first and second transistor pair and to said common terminal and forming a shunt to remove bias from said bases.

4. The dual discharge network of claim 3, wherein:

said means for changing said switch includes a control voltage means connected to said switch;

said switch is arranged to close and form a said shunt path from said common terminal in response to said control voltage and to open and break said shunt path in response to the absence of said control voltage.

5. The dual discharge network of claim 3, wherein:

said switch includes a plurality of transistors arranged to form a high impedance path in the absence of control signal and to be conductive and form a low impedance path in the presence of said control signal.

6. The dual discharge network of claim 5, wherein:

said switch includes a plurality of MOSFET's connected source to source, to form said high impedance path.

7. The dual discharge network of claim 6, wherein:

said first transistor pair includes a first NPN transistor with its collector connected to the said first gate, its base connected to said common terminal and a PNP transistor with its collector connected to said second gate, its emitter connected to the emitter of said NPN transistor and its base connected to ground.

8. The dual discharge network of claim 7, wherein:

said first NPN transistor of said first transistor pair arranged to be biased to conduct in response to said positive signal at said common terminal and to provide bias for said PNP transistor of said first transistor pair.

said NPN and said PNP transistors of said first transistor pair arranged to form a conductive path between said first gate and said second gate to discharge said first and said second gate.

9. The dual discharge network of claim 8, wherein:

said second transistor pair includes an PNP transistor with its collector connected to the said second gate, its base connected to said common terminal and a NPN transistor with its collector connected to said first gate, its emitter connected to the emitter of said PNP transistor and its base connected to ground.

10. The dual discharge network of claim 9, wherein:

said PNP transistor of said second transistor pair arranged to be biased to conduct in response to said positive signal at said common terminal and to bias said NPN transistor of said second transistor pair into conduction;

said NPN and said PNP transistors of said second transistor pair arranged to form a conductive path between said second gate and said first gate to discharge said first and said second gate.

11. The dual discharge network of claim 3, wherein:

said common terminal is an I/O input terminal.

12. The dual discharge network of claim 1, wherein:

said first discharge network includes a NPN and a PNP transistor; and said second discharge network includes a PNP and an NPN transistor.

13. The dual discharge network of claim 12, wherein:

said first gate is biased positively and said second gate is biased negatively.

14. The dual discharge network of claim 13, wherein:

said common terminal is an I/O input terminal.

15. A dual discharge network for reducing residual charge on the gates of MOSFET over-voltage protection devices, comprising:

a first MOSFET over-voltage protection device having a first gate terminal and a first input terminal;

a second MOSFET over-voltage protection device having a second gate terminal and a second input terminal;

said first and second input terminals connected to common terminal;

a first discharge network including a first semiconductor connected to said first gate terminal;

a second discharge network including a second semiconductor connected to said second gate terminal;

said first input terminal and said second input terminal connected to said common terminal, to discharge the said first and second gates terminals of said first and second MOSFET's.

said first semiconductor arranged to be biased into conduction by a positive signal at said common terminal;

said second semiconductor arranged to be biased into conduction by a negative signal at said common terminal and to discharge the said first and second gates of said first and second MOSFET's;

said first semiconductor is a pair of semiconductors of opposite polarity and having a first input terminal;

said second semiconductor is a semiconductor pair of opposite polarity and a second input terminal;

said first semiconductor pair is a first transistor pair and said second semiconductor pair is a second transistor pair; and said first transistor pair and said second transistor pair are arranged to receive base emitter bias from said common terminal and collector voltage from said first and second gates, respectively.

* * * * *